United States Patent
Tan et al.

(10) Patent No.: US 12,341,021 B2
(45) Date of Patent: Jun. 24, 2025

(54) SELECTIVE ETCH USING DEPOSITION OF A METALLOID OR METAL CONTAINING HARDMASK

(71) Applicant: Lam Research Corporation, Fremont, CA (US)

(72) Inventors: Samantha Siamhwa Tan, Newark, CA (US); Daniel Peter, Sunnyvale, CA (US); Arunima Deya Balan, Mountain View, CA (US); Younghee Lee, Pleasanton, CA (US); Yang Pan, Los Altos, CA (US)

(73) Assignee: Lam Research Corporation, Fremont, CA (US)

( * ) Notice: Subject to any disclaimer, the term of this patent is extended or adjusted under 35 U.S.C. 154(b) by 287 days.

(21) Appl. No.: 17/914,296

(22) PCT Filed: Apr. 6, 2021

(86) PCT No.: PCT/US2021/026063
§ 371 (c)(1),
(2) Date: Sep. 23, 2022

(87) PCT Pub. No.: WO2021/207286
PCT Pub. Date: Oct. 14, 2021

(65) Prior Publication Data
US 2023/0118701 A1 Apr. 20, 2023

Related U.S. Application Data

(60) Provisional application No. 63/007,201, filed on Apr. 8, 2020.

(51) Int. Cl.
*H01L 21/311* (2006.01)

(52) U.S. Cl.
CPC .. *H01L 21/31116* (2013.01); *H01L 21/31144* (2013.01)

(58) Field of Classification Search
CPC . H01L 21/31116; H01L 21/306–31144; H01L 21/3086; H01L 21/31506;
(Continued)

(56) References Cited

U.S. PATENT DOCUMENTS

| | | |
|---|---|---|
| 6,905,968 B2 | 6/2005 | Hsieh et al. |
| 8,771,539 B2 | 7/2014 | Zhang et al. |

(Continued)

FOREIGN PATENT DOCUMENTS

| | | | | |
|---|---|---|---|---|
| CN | 110137134 A | * | 8/2019 | ....... H01L 21/76897 |
| KR | 10-1592850 | | 2/2016 | |

(Continued)

OTHER PUBLICATIONS

R. D. Allen, G. M. Wallraff, D. C. Hofer, R. R. Kunz, "Photoresists for 193-nm Lithography" Jan./Mar. 1997, IBM Journal of Research and Development (vol. 41, Issue 1.2, Jan. 1997) (Year: 1997).*
(Continued)

*Primary Examiner* — Joshua L Allen
*Assistant Examiner* — Andrew Keelan Laobak
(74) *Attorney, Agent, or Firm* — Beyer Law Group LLP (57) ABSTRACT

A method for selectively etching at least one feature in a silicon oxide region with respect to a lower oxygen containing region is provided. An etch gas comprising a metalloid or metal containing precursor and a halogen containing component is provided. The etch gas is formed into a plasma. At least one feature in the silicon oxide region is selectively etched with respect to the lower oxygen containing region, while simultaneously forming a metalloid or metal containing hardmask over the lower oxygen containing region.

19 Claims, 6 Drawing Sheets

(58) Field of Classification Search
CPC .............. H01L 21/0335; H01L 21/426; H01L 21/76813; H01L 21/76811
See application file for complete search history.

(56) References Cited

U.S. PATENT DOCUMENTS

| | | | |
|---|---|---|---|
| 2003/0232504 A1* | 12/2003 | Eppler | .............. H01L 21/32136 257/E21.252 |
| 2009/0159560 A1 | 6/2009 | Kiehlbauch et al. | |
| 2009/0184089 A1* | 7/2009 | Chebi | .............. H01J 37/32449 216/13 |
| 2017/0358460 A1 | 12/2017 | Tomura et al. | |
| 2019/0385902 A1* | 12/2019 | Wang | .............. H01L 21/823431 |
| 2019/0393046 A1* | 12/2019 | Wang | ................ H01L 21/31144 |
| 2020/0006073 A1* | 1/2020 | Smith | ..................... C23C 16/04 |
| 2020/0066730 A1* | 2/2020 | Guo | .................... H10B 12/482 |
| 2020/0090944 A1* | 3/2020 | Lee | ................... H01L 21/02063 |
| 2021/0005472 A1 | 1/2021 | Kanarik et al. | |

FOREIGN PATENT DOCUMENTS

| | | | |
|---|---|---|---|
| WO | 2019/178030 | 9/2019 | |
| WO | WO-2019178030 A1 * | 9/2019 | ....... H01L 21/30655 |

OTHER PUBLICATIONS

International Search Report for the International Application No. PCT/US2021/026063 dated Jul. 2, 2021.

Written Opinion for the International Application No. PCT/US2021/026063 dated Jul. 2, 2021.

\* cited by examiner

SELECTIVE ETCH USING DEPOSITION OF A METALLOID OR METAL CONTAINING HARDMASK

CROSS REFERENCE TO RELATED APPLICATION

This application claims the benefit of priority of U.S. Application No. 63/007,201, filed Apr. 8, 2020, which is incorporated herein by reference for all purposes.

BACKGROUND

The background description provided here is for the purpose of generally presenting the context of the disclosure. Information described in this background section, as well as aspects of the description that may not otherwise qualify as prior art at the time of filing, are neither expressly nor impliedly admitted as prior art against the present disclosure.

The disclosure relates to methods of forming semiconductor devices on a semiconductor wafer. More specifically, the disclosure relates to the selective etching of silicon oxide ($SiO_2$) with respect to other materials.

The smallest feature dimensions of semiconductor devices are constantly shrinking to follow Moore's law. One of these features is the contact between the $1^{st}$ metal layer and the silicon layer with gates and source/drains (S/D). Such features are typically prepared by a process called self-aligned contact (SAC). In a SAC etch, $SiO_2$ is etched to form a hole or a trench. Later, the hole or trench is filled with a contact metal. A selective $SiO_2$ etch is employed to selectively etch $SiO_2$ with respect to a spacer material. The spacer material is typically a lower oxygen containing silicon material such as silicon nitride, silicon oxy-nitride, or silicon oxy-carbo-nitride. Many selective etch processes are not selective enough. As a result too much of the spacer material or corners of the spacer material may be etched increasing electric leakage and device failure rates.

SUMMARY

To achieve the foregoing and in accordance with the purpose of the present disclosure, a method for selectively etching at least one feature in a silicon oxide region with respect to a lower oxygen containing region is provided. An etch gas comprising a metalloid or metal containing precursor and a halogen containing component is provided. The etch gas is formed into a plasma. At least one feature in the silicon oxide region is selectively etched with respect to the lower oxygen containing region, while simultaneously forming a metalloid or metal containing hardmask over the lower oxygen containing region.

These and other features of the present disclosure will be described in more detail below in the detailed description of the disclosure and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION OF THE EXEMPLARY EMBODIMENTS

The present disclosure will now be described in detail with reference to a few exemplary embodiments thereof as illustrated in the accompanying drawings. In the following description, numerous specific details are set forth in order to provide a thorough understanding of the present disclosure. It will be apparent, however, to one skilled in the art, that the present disclosure may be practiced without some or all of these specific details. In other instances, well-known process steps and/or structures have not been described in detail in order to not unnecessarily obscure the present disclosure.

The hole or trench of the contacts needs to be very accurately placed in respective to the underlying gate and S/D. Current photolithography tools can only partially meet the placement requirement of the contacts. Therefore, the contact etch can expose the spacer around the gate, Such exposure often leads to corner loss of the space material resulting in an electric leakage.

The selective $SiO_2$ etch can be achieved by the protection of the spacer against an etch using the selective deposition of a carbon-based polymer on the spacer material. However, the lateral dimensions of the hole and trench in the 5 nanometers (nm) node and below can be smaller than 10 nm. More typically in the of 5-15 nm range. The aspect ratio can be larger than 6:1. The aspect ratio may range from 6:1 to 12:1. The use of a carbon-based polymer mask has a limited etch resistance. The limited etch resistance requires deposition of a thick mask to protect the spacer during the $SiO_2$ etch. Placing thick polymer material on the spacer can clog up and pinch-off the contact and block any further etch. This pinch-off would result in an electrical open contact, causing a device failure.

In this disclosure, a new process and apparatus are described. The process and apparatus enable the selective deposition of a metalloid or metal containing mask such as metal carbide on the spacer material during the etch process. This mask is not formed by the initial photolithography but in-situ during the etch process. Due to the higher etch selectivity of a metalloid or metal containing mask compared to the traditional carbon-based polymer mask, a thinner, less than 5 nm hardmask, is sufficient. This metalloid or metal containing hardmask can prevent the corner loss of the spacer and the pinch-off issues of the traditional polymer material.

Figure 1:
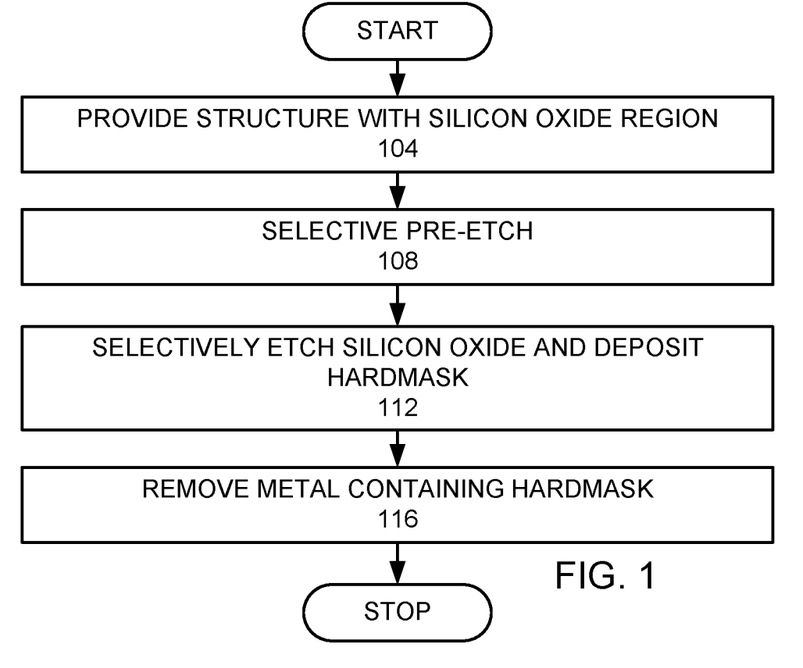
FIG. 1 is a high level flow chart of an embodiment.
Figure 2A:
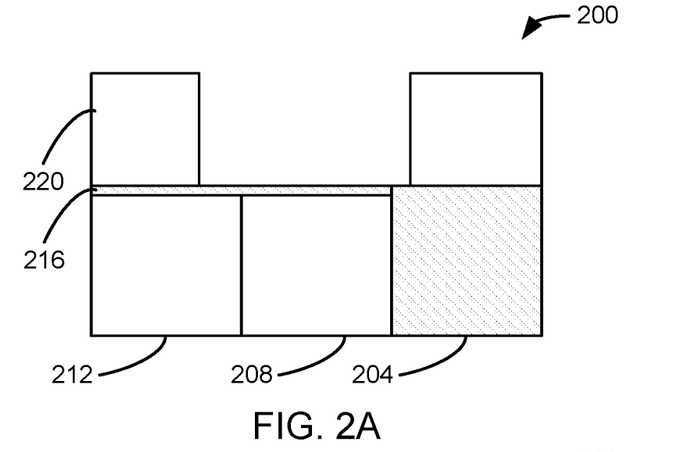
FIGS. 2A-E are schematic cross-sectional views of structures processed according to an embodiment.

In order to facilitate understanding, FIG. 1 is a high level flow chart of an embodiment. A structure with a silicon oxide region is provided (step 104). FIG. 2A is a schematic cross-sectional view of part of a structure 200 with a silicon oxide region 204. In this example, the structure 200 also has a silicon oxycarbonitride (SiOCN) region 208, and a silicon (Si) region 212. The silicon region 212 may be crystalline or polycrystalline, or amorphous silicon. The SiOCN material may include silicon oxynitride (SiON), silicon oxycarbide (SiOC), silicon carbonitride (SiCN), organosilicon oxide (SiOCHx) (back end of line (BEOL) low-k), silicon nitride (SiN), or silicon carbide (SiC). The SiOCN region 208 and the Si region 212 are designated as lower oxygen containing regions since they have a lower concentration of oxygen than the silicon oxide regions 204. In this embodiment, a native silicon oxide layer 216 naturally forms over the SiOCN region 208 and the silicon region 212, when the SiOCN region 208 and the silicon region are exposed to air. A photolithographic mask 220 of patterned photoresist is formed over the structure 200, as shown.

Figure 2B:
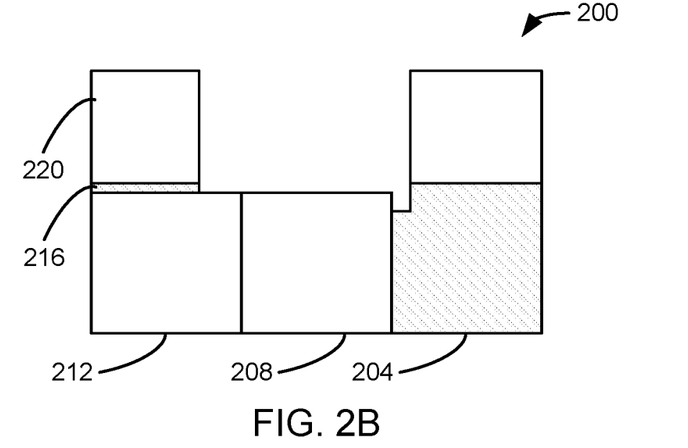

After the structure is provided, a selective pre-etch is provided (step 108) that selectively etches the silicon oxide region 204 and the native silicon oxide layer 216 not covered by the photolithographic mask 220. In this embodiment, the silicon oxide region 204 is selectively etched using an atomic layer etch (ALE). In this embodiment, the ALE provides a reactant gas of hexafluoro-1,3-butadiene ($C_4F_6$). The $C_4F_6$ forms a polymer deposition layer over the silicon oxide region 204 and the native silicon oxide layer 216. The reactant gas is purged and an activation gas of argon (Ar) is provided. The Ar activates the deposition layer causing deposited fluorine to selectively etch the silicon oxide region 204 and the native silicon oxide layer 216. The ALE process of a selective deposition and selective etch steps may be repeated for a plurality of cycles. FIG. 2B is a cross-sectional view of the structure 200 after the selective pre-etch (step 108) is complete. In this example, the silicon oxide region 204 not covered by the photolithographic mask 220 is partially etched and the native silicon oxide layer 216 not covered by the photolithographic mask 220 has been etched away. The selective deposition of polymer and selectively etching the silicon oxide region 204 may be repeated, until the silicon oxide region 204 is sufficiently etched and the native silicon oxide layer 216 is removed. Such an etch process selectively etches the silicon oxide region 204. However, the selectivity is not high enough. Some of the SiOCN region 208 and Si region 212 is also etched away. Therefore, this etch is only used for a pre-etch process in this embodiment. In some embodiments, the pre-etch process is not used.

Figure 3:
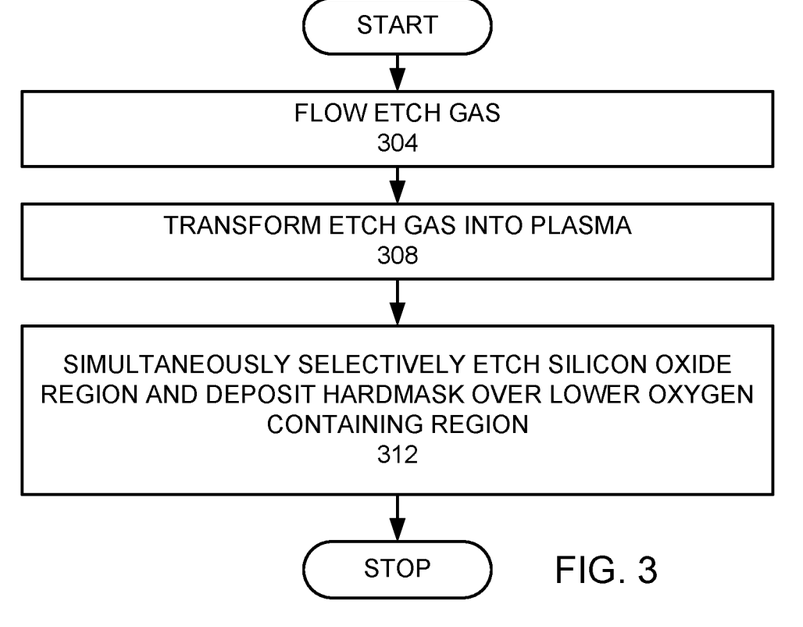
FIG. 3 is a more detailed flow chart of a selective etch of the silicon oxide region while depositing a metalloid or metal containing hardmask.

After the selective pre-etch is completed (step 108), a selective etch of the silicon oxide region 204 is provided while depositing a metalloid or metal containing hardmask (step 112). FIG. 3 is a more detailed flow chart of a selective etch of the silicon oxide region 204 while depositing a metalloid or metal containing hardmask (step 112). In such an embodiment, an etch gas with a metalloid or metal containing precursor and a halogen containing component is provided (step 304). In this embodiment, the etch gas comprises tungsten hexafluoride ($WF_6$), difluoromethane ($CH_2F_2$), oxygen ($O_2$) and argon (Ar). The etch gas is provided (step 304) by flowing the etch gas into a plasma processing chamber. While the etch gas is flowed into the plasma processing chamber, radio frequency power is provided to transform the etch gas into a plasma (step 308). In an example, a chamber pressure of 2-500 mTorr is provided. The etch gas comprises 1-200 sccm $WF_6$, 1-300 sccm $CH_2F_2$, oxygen 1-200 sccm, and 50-1000 sccm Ar. In an embodiment, a substrate or chuck temperature in the range of 30° C. to 150° C. is provided. In other embodiments, a substrate or chuck temperature in the range of 30° C. to 200° C. is provided. In other embodiments, the substrate or chuck is maintained at a temperature of no more than about 200° C. In other embodiments, the substrate or chuck is maintained at a temperature of no more than about 300° C. To form the etch gas into a plasma and provide bias, 20-1000 W (transformer coupled plasma (TCP) and bias) is provided at radio frequencies such as one or more of 13.56 megahertz (MHz), 60 MHz, 27 MHz, 2 MHz, 1 MHz, 400 kilohertz (kHz), or combinations thereof. The plasma simultaneously selectively etches the silicon oxide region with respect to the lower oxygen containing region and forms a metalloid or metal containing hardmask over the lower oxygen containing region (step 312).

Figure 2C:
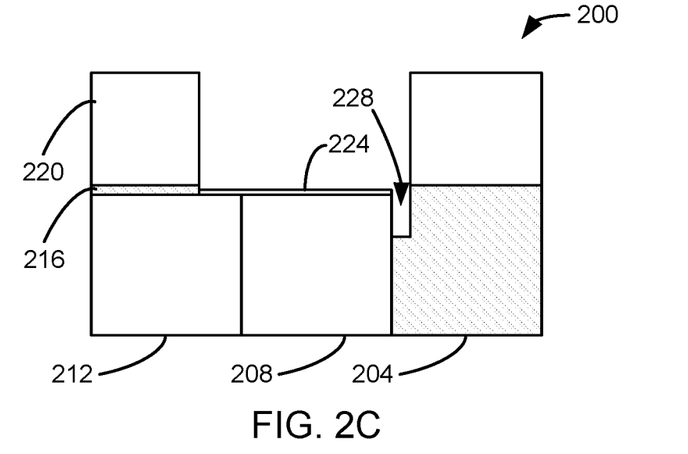

FIG. 2C is a cross-sectional view of the structure 200 after the selective etch of the silicon oxide region 204 while depositing a metalloid or metal containing hardmask (step 112) partially etches a feature 228 in the silicon oxide region 204. Fluorine and carbon in the plasma etch the silicon oxide region 204. Hydrogen, carbon, and the metal in the plasma selectively deposit metalloid or metal containing hardmask 224 on the SiOCN region 208 and the Si region 212. Hydrogen and carbon in the plasma can reduce the metalloid or metal containing precursor or its plasma fragment to deposit the metalloid or metal containing hardmask 224 selectively on the SiOCN region 208 and the Si region 212. Alternatively, hydrogen and carbon in the plasma selectively deposit a hydrocarbon containing layer that reacts with the metalloid or metal containing precursor or its fragment to form the metalloid or metal containing hardmask 224 on the SiOCN region 208 and the Si region 212. The oxygen containing component of the etch gas maintains the etch of the silicon oxide region 204 by preventing or minimizing the deposition of the hydrocarbon containing layer or the metalloid or metal containing hardmask 224 on of the silicon oxide region 204. In this embodiment, the metalloid or metal containing hardmask 224 is a tungsten carbide hardmask. The metalloid or metal containing hardmask 224 prevents or minimizes the etching of the lower oxygen containing regions, while the silicon oxide region 204 is etched. As a result, the etch selectivity may approach infinity.

Figure 2D:
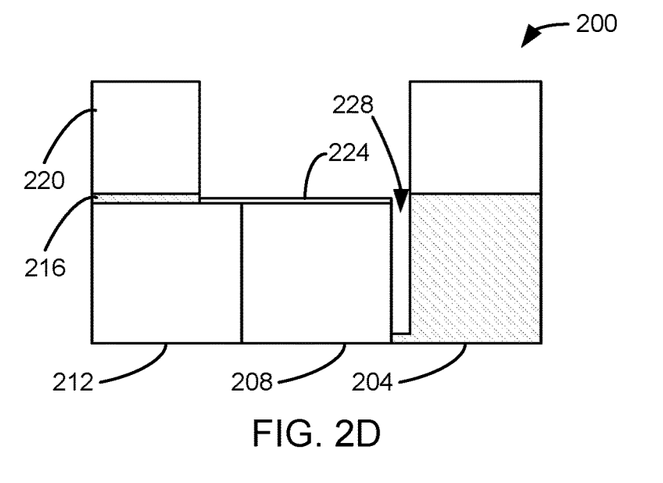

FIG. 2D is a cross-sectional view of the structure 200 after the selective etch of the silicon oxide region 204 has been sufficiently etched. Since the metalloid or metal containing hardmask 224 is continuously deposited during the etching of the silicon oxide region 204 and since the metalloid or metal containing hardmask 224 is resistant to the etch, the lower oxygen containing regions are not etched. In this embodiment, when the etching of the silicon oxide region 204 is complete, the metalloid or metal containing hardmask 224 remains.

Figure 2E:
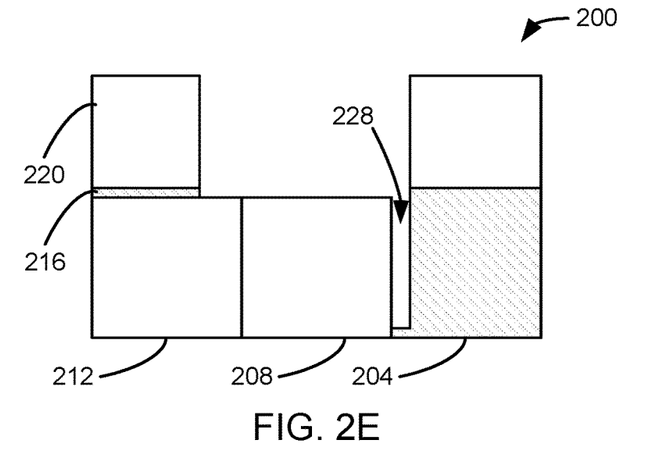

After the etching of the silicon oxide region 204 is complete, the metalloid or metal containing hardmask 224 is removed. In this embodiment, a wet clean is used to remove the metalloid or metal containing hardmask 224. In the embodiment, an aqueous solution of ammonia ($NH_3$) and hydrogen peroxide ($H_2O_2$) is used to selectively remove the metalloid or metal containing hardmask 224 with respect to the silicon oxide region 204. FIG. 2E is a cross-sectional view of the structure 200 after the metalloid or metal containing hardmask 224 has been removed.

This embodiment provides a highly selective etch of silicon oxide with respect to lower oxygen containing regions. In various embodiments, the depth to width aspect ratio of the feature 228 etched in the silicon oxide region 204 is at least 6:1. For example, the feature 228 has a depth to width aspect ratio is between 6:1 and 12:1. In this example, the feature 228 has a width of less than 10 nm. In various embodiments, the feature 228 has a width of between 6 to 15 nm. The use of the metalloid or metal containing hardmask 224 prevents or reduces the etching of the SiOCN region 208, so that corner loss of the SiOCN region 208 is prevented or reduced. In addition, since the metalloid or metal containing hardmask 224 is kept thin, clog up and pinch-off of the feature 228 is prevented. In some embodiments, the partial etch of the pre-etch step (step 108). Provides a geometry, where the silicon oxide region 204 is recessed. In some embodiments, the recessed geometry of the silicon oxide region 204 allows for more selective deposition of the metalloid or metal containing hardmask 224 and selective etch of the silicon oxide region 204.

The etch resistance of the metalloid or metal containing hardmask 224 is high because a metalloid or metal containing material such as metal carbide has a very high melting and boiling point. In other embodiments, other metalloid or metal containing hardmasks made of metal nitride, metal boride, or metal silicide can be used instead of metal carbide or together with metal carbide as long as the metalloid or metal containing hardmasks have a high etch resistance. Since this embodiment provides a metalloid or metal containing hardmask 224 with a high etch resistance, the mask thickness may be less than 5 nm. This thin hardmask enables the etch of very narrow features <15 nm by avoiding the clogging risk.

In alternative embodiments, near the end of the etching of the silicon oxide region 204, the flow of the metalloid or metal containing precursor is reduced or stopped so that the deposition of the metalloid or metal containing hardmask 224 is reduced or stopped. In one embodiment, at the end of the etch of the silicon oxide region 204 the metalloid or metal containing hardmask 224 is etched away so that removal of the metalloid or metal containing hardmask (step 116) is not needed. In another embodiment, a dry etch is used to selectively remove the metalloid or metal containing hardmask (step 116) with respect to the silicon oxide region 204.

In another embodiment, the metalloid or metal containing precursor and a halogen containing component is molybdenum hexafluoride ($MoF_6$). In other embodiments, the metalloid or metal containing precursor may be other metalloid halides or metal halides. In such embodiments, metalloids, such as silicon (Si), germanium (Ge), or metals, such as tin (Sn), titanium (Ti), zirconium (Zr), hafnium (Hf), vanadium (V), niobium (Nb), tantalum (Ta), boron (B), aluminum (Al), gallium (Ga), indium (In), iron (Fe), ruthenium (Ru), rhenium (Re), antimony (Sb), tungsten (W), molybdenum (Mo), and bismuth (Bi), may be used if a metalloid or metal halogen exists to allow the metalloid or metal halide to be flowed as a gas or vapor. In some embodiments, a liquid metal halide may be heated to form a metal halide vapor. In some embodiments, a solid metal halide may be heated to sublime to form a metal halide vapor. Generally, metalloid chlorides, metal chlorides, metalloid fluorides, or metal fluorides are the only halides that are volatile that may be flowed as a gas in chambers that are not at high temperatures. Metalloid or metal bromides may be used in other embodiments. In other embodiments, the precursor may be metalloid or metal oxyhalides. In some embodiments, the hardmask is a metal containing hardmask.

In embodiments that deposit a hydrocarbon containing layer, the hydrocarbon containing layer may be a pure hydrocarbon layer. In other embodiments, other constituents, such as hydrofluorocarbons may be present in addition to hydrocarbons. In other embodiments, the hydrocarbon containing layer may comprise hydrofluorocarbon.

In other embodiments, other lower oxygen regions may be used in place of the lower oxygen silicon containing regions. For example, silicon germanium (SiGe), germanium (Ge), elemental metal or metal nitrides may form the lower oxygen regions and may be protected, so that $SiO_2$ may be selectively etched with respect to these materials.

In various embodiments, in addition to comprising a metalloid or metal containing precursor, the etch gas comprises a carbon containing component and a hydrogen containing component. In some embodiments, the hydrogen containing component and the carbon containing component comprises at least one of difluoromethane ($CH_2F_2$), fluoroform ($CHF_3$), fluoromethane ($CH_3F$), methane ($CH_4$), hexafluoro-2-butyne ($C_4F_6$), acetylene ($C_2H_2$), carbon tetrafluoride ($CF_4$), and octafluorocyclobutane ($C_4F_8$). In some embodiments, the etch gas further comprises an oxygen containing component. In some embodiments, the oxygen containing component comprises at least one of oxygen ($O_2$), ozone ($O_3$), carbon dioxide ($CO_2$), carbon monoxide (CO), nitric oxide (NO), nitrogen dioxide ($NO_2$), nitrous oxide ($N_2O$), sulfur dioxide ($SO_2$), sulfur trioxide ($SO_3$), water ($H_2O$), peroxide ($H_2O_2$), and carbonyl sulfide (COS). In various embodiments, the etch gas further comprises an inert gas. In some embodiments, the inert gas is selected from the group consisting of nitrogen, helium, argon, and neon. In various embodiments, a plasma is formed at a pressure of 5-500 millitorr with a power of 30-500 Watts at radio frequencies such as one or more of 13.56 megahertz (MHz), 60 MHz, 27 MHz, 2 MHz, 1 MHz, 400 kilohertz (kHz), or combinations thereof.

Another embodiment uses the same step in the previous embodiment of providing a structure with a silicon oxide region (step 104). In addition, this embodiment may use the same step of a selective pre-etch (step 108) that selectively etches the silicon oxide region 204 and the native silicon oxide layer 216, as used in the previous embodiment. In this embodiment, the selective etch of the silicon oxide region 204 while depositing a metalloid or metal containing hardmask (step 112) uses a different etch gas chemistry than the etch gas chemistry used in the previous embodiment. In this embodiment, the etch gas comprises a metalloid or metal containing precursor and a halogen containing component. In an embodiment, an etch gas comprising $WF_6$ and hydrogen ($H_2$) is flowed (step 304). The etch gas is transformed into a plasma (step 308). The plasma simultaneously selectively etches the silicon oxide region 204 with respect to the lower oxygen containing region and forms a metalloid or metal containing hardmask over the lower oxygen containing region (step 312).

In various embodiments, the selective pre-etch (step 108) allows the removal of any native silicon oxide layer 216. If the lower oxygen containing region does not form a native oxide layer, the selective pre-etch (step 108) may not be needed. The partial etching of the silicon oxide region 204 by the selective pre-etch (step 108) helps to improve the selective deposition of a hardmask. However, the hardmask may be selectively deposited without the selective pre-etch (step 108).

Figure 4:
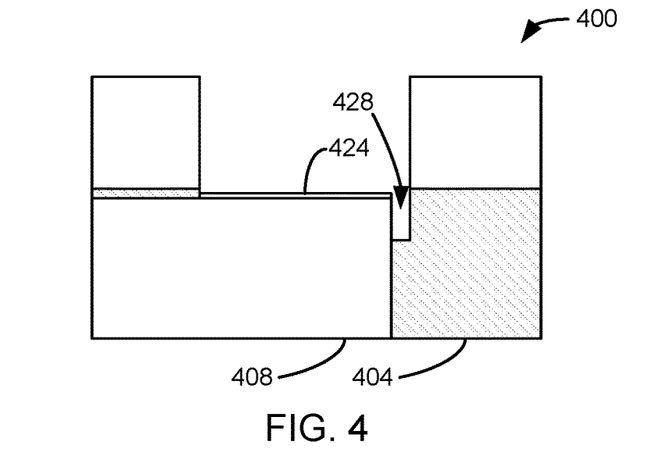
FIG. 4 schematic cross-sectional views of a structure processed according to another embodiment.

FIG. 4 is a cross-sectional view of a structure 400 after the selective etch of a silicon oxide region 404 while depositing a metalloid or metal containing hardmask (step 112) partially etches the silicon oxide region 404 with respect to a lower oxygen containing region 408. The metalloid or metal containing precursor of $WF_6$ and the reducing agent of $H_2$ causes a native metal hardmask 424 of tungsten to selectively deposit on the lower oxygen containing region 408 with respect to the silicon oxide region 404. The halogen containing component of $WF_6$ provides a halogen of fluorine. Fluorine in the plasma etches a feature 428 in the silicon oxide region 404 while the native metal hardmask 424 prevents the lower oxygen containing region 408 from being etched. Such an embodiment may provide an infinite etch selectivity. A lower concentration of oxygen and a higher concentration of silicon in the lower oxygen containing region 408 cause the native metal hardmask 424 to selectively deposit on the lower oxygen containing region 408 with respect to the silicon oxide region 404.

Figure 5:
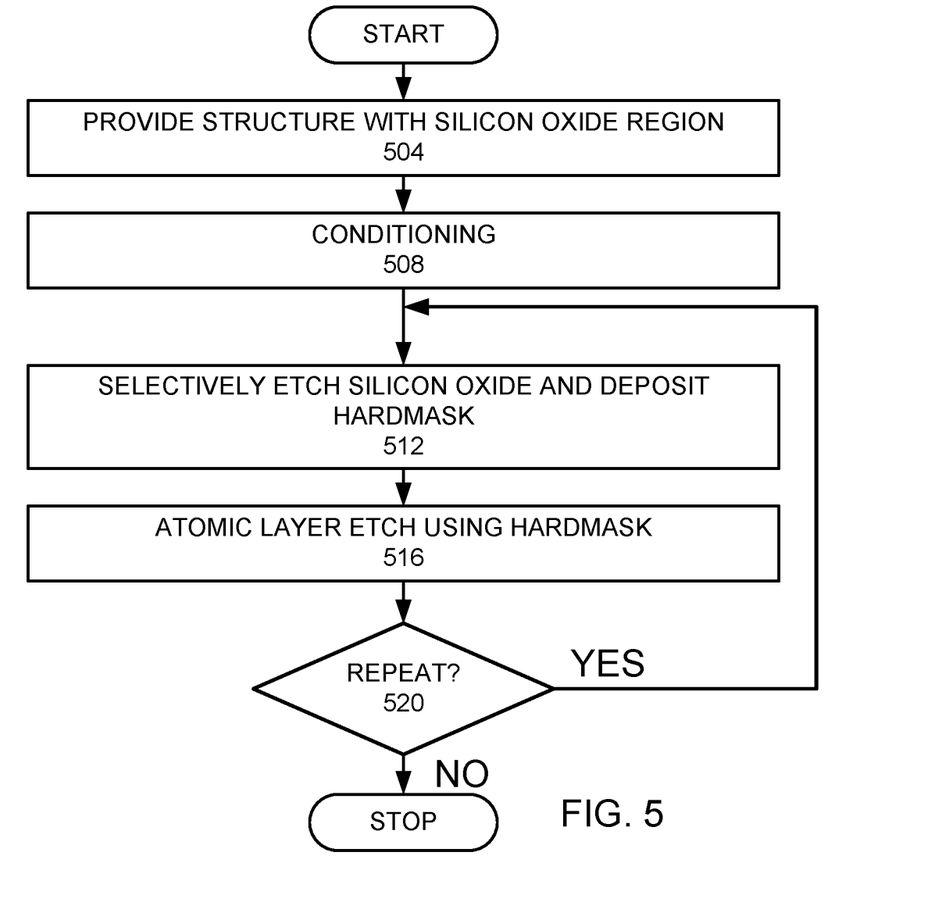
FIG. 5 is a high level flow chart of another embodiment.

Another embodiment is shown by the flow chart shown in FIG. 5. In such an embodiment, a structure is provided with a silicon oxide region (step 504). A conditioning is provided (step 508). The conditioning may be used to condition the structure to provide an improved selective etch. Some embodiments may not use a conditioning process. After the conditioning is provided, a selective etch of the silicon oxide region is provided while depositing a metalloid or metal containing hardmask (step 512). In some embodiments, the conditioning comprises providing a pretreatment plasma such as a plasma formed from at least one of $H_2$, nitrogen ($N_2$), $H_2/N_2$, and $NH_3$.

In this embodiment, after the silicon oxide region has been partially etched leaving a metalloid or metal containing hardmask, the silicon oxide region is further or additionally etched by an atomic layer etch (ALE) process utilizing the metalloid or metal containing hard mask (step 516). In this embodiment, the ALE provides a reactant gas of $C_4F_6$. The $C_4F_6$ forms a polymer deposition layer over the silicon oxide region and the metalloid or metal containing hardmask. The reactant gas is purged and an activation gas of Ar is provided. The Ar activates the deposition layer causing deposited fluorine to selectively etch the silicon oxide region with respect to the metalloid or metal containing hard mask. The ALE process of a selective deposition and selective etch steps may be repeated for a plurality of cycles.

Since the ALE process does not deposit the metalloid or metal containing hardmask, the metalloid or metal containing hardmask may be consumed during the ALE process. If the metalloid or metal containing hardmask is sufficiently consumed before etching of the silicon oxide region is completed, the ALE process (step 516) may be stopped and the selective etch of the silicon oxide region while depositing a metalloid or metal containing hardmask (step 512) may be repeated (step 520) in order to replenish the metalloid or metal containing hardmask. After the metalloid or metal hardmask has been replenished, the selective etching of the silicon oxide region while depositing a metalloid or metal containing hardmask (step 512) is stopped. The ALE process may be used to further etch the silicon oxide region (step 516). The steps of selectively etching the silicon oxide and depositing the metalloid or metal containing hardmask (step 512) and the ALE using the metalloid or metal containing hardmask (step 516) may be cyclically repeated until the feature in the silicon oxide region is sufficiently etched. Once the feature in the silicon oxide region is sufficiently etched the cyclical process may be stopped. Since the ALE process (step 516) consumes the metalloid or metal hardmask, in this embodiment a separate metal or metalloid hardmask removal step is not needed.

In other embodiments, other hydrogen containing components and other halogen containing components may be used. For example, hydrogen fluoride (HF), ammonia ($NH_3$), borane ($BH_3$), or silane ($SiH_4$) may replace $H_2$.

In another embodiment, a selective carbon deposition would be used as pre-treatment. This carbon layer preferentially deposits in the lower oxygen containing regions, enabling an increased deposition of metal carbide on these respective layers.

In some embodiments, the deposition of the hardmask and etching may be done in separate sequential steps. However, simultaneously depositing the hardmask and etching in a single continuous step may provide a faster process.

Figure 6:
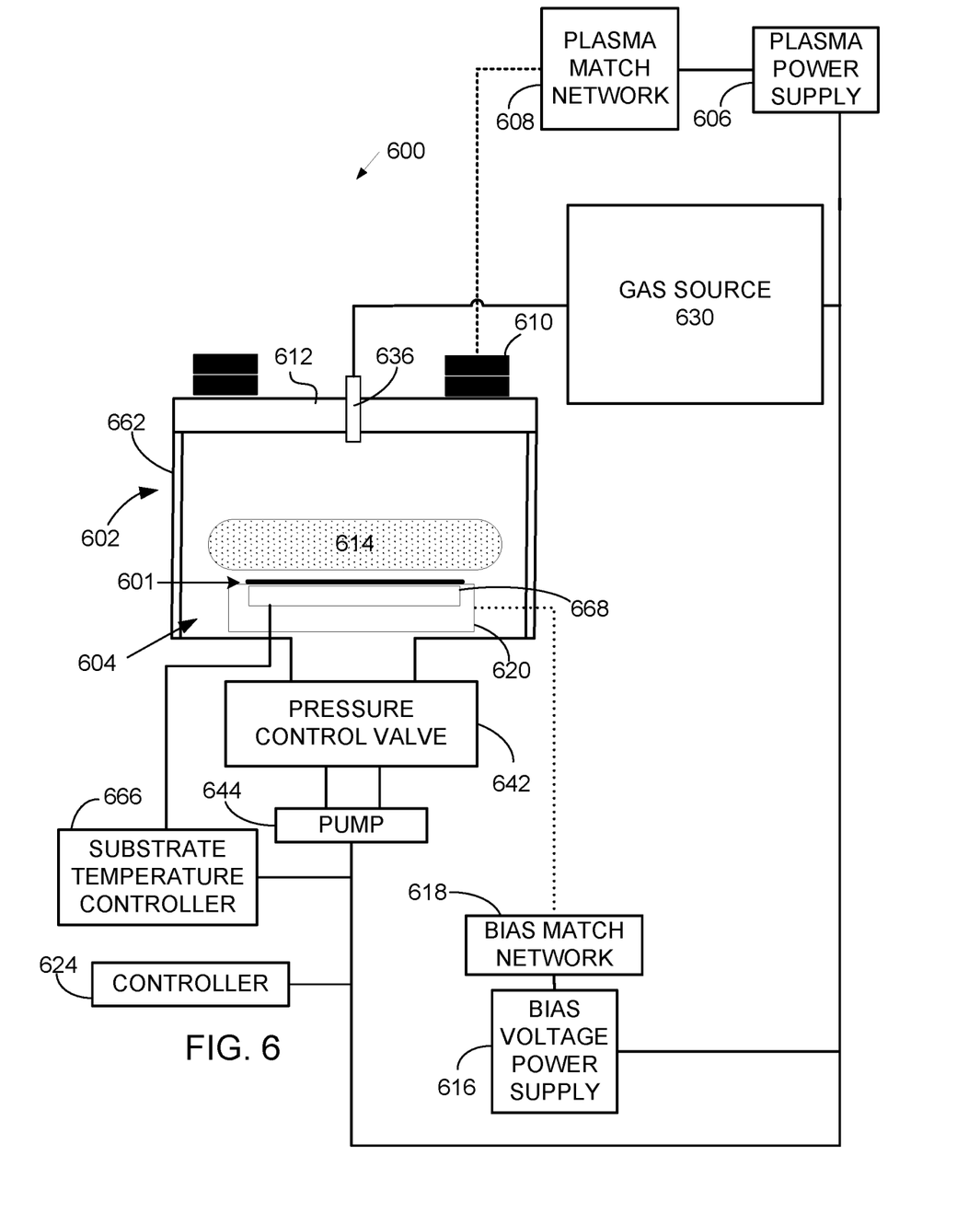
FIG. 6 is a schematic view of a etch chamber that may be used in an embodiment.

In an example, FIG. 6 schematically illustrates an example of a plasma processing system 600 that may be used in an embodiment. The plasma processing system 600 may be used to process a substrate 601 in accordance with one embodiment. The plasma processing system 600 includes a plasma reactor 602 having a plasma processing chamber 604, enclosed by a chamber wall 662. A plasma power supply 606, tuned by a plasma match network 608, supplies power to a TCP coil 610 located near a power window 612 to create a plasma 614 in the plasma processing chamber 604 by providing an inductively coupled power. The TCP coil (upper power source) 610 may be configured to produce a uniform diffusion profile within the plasma processing chamber 604. For example, the TCP coil 610 may be configured to generate a toroidal power distribution in the plasma 614. The power window 612 is provided to separate the TCP coil 610 from the plasma processing chamber 604 while allowing energy to pass from the TCP coil 610 to the plasma processing chamber 604. A wafer bias voltage power supply 616 tuned by a bias match network 618 provides power to an electrode 620 to set the bias voltage on the substrate 601. The electrode 620 provides a chuck for the substrate 601, where the electrode 620 acts as an electrostatic chuck. A substrate temperature controller 666 is controllably connected to a Peltier heater/cooler 668. A controller 624 controls the plasma power supply 606, the substrate temperature controller 666, and the wafer bias voltage power supply 616.

The plasma power supply 606 and the wafer bias voltage power supply 616 may be configured to operate at specific radio frequencies such as 13.56 megahertz (MHz), 60 MHz, 27 MHz, 2 MHz, 1 MHz, 400 kilohertz (kHz), or combinations thereof. Plasma power supply 606 and wafer bias voltage power supply 616 may be appropriately sized to supply a range of powers in order to achieve desired process performance. For example, in one embodiment, the plasma power supply 606 may supply the power in a range of 50 to 5000 Watts, and the wafer bias voltage power supply 616 may supply a bias voltage in a range of 20 to 2000 Volt. In addition, the TCP coil 610 and/or the electrode 620 may be comprised of two or more sub-coils or sub-electrodes. The two or more sub-coils or sub-electrodes may be powered by a single power supply or powered by multiple power supplies.

As shown in FIG. 6, the plasma processing system 600 further includes a gas source 630. The gas source 630 provides gas or remote plasma to a feed 636 in the form of a nozzle. The process gases and byproducts are removed from the plasma processing chamber 604 via a pressure control valve 642 and a pump 644. The pressure control valve 642 and the pump 644 also serve to maintain a particular pressure within the plasma processing chamber 604. The gas source 630 is controlled by the controller 624. A Kiyo® by Lam Research Corp. of Fremont, CA, may be used to practice an embodiment. This embodiment is an inductively coupled plasma system. In other embodiments, a capacitively coupled plasma system may be used.

Figure 7:
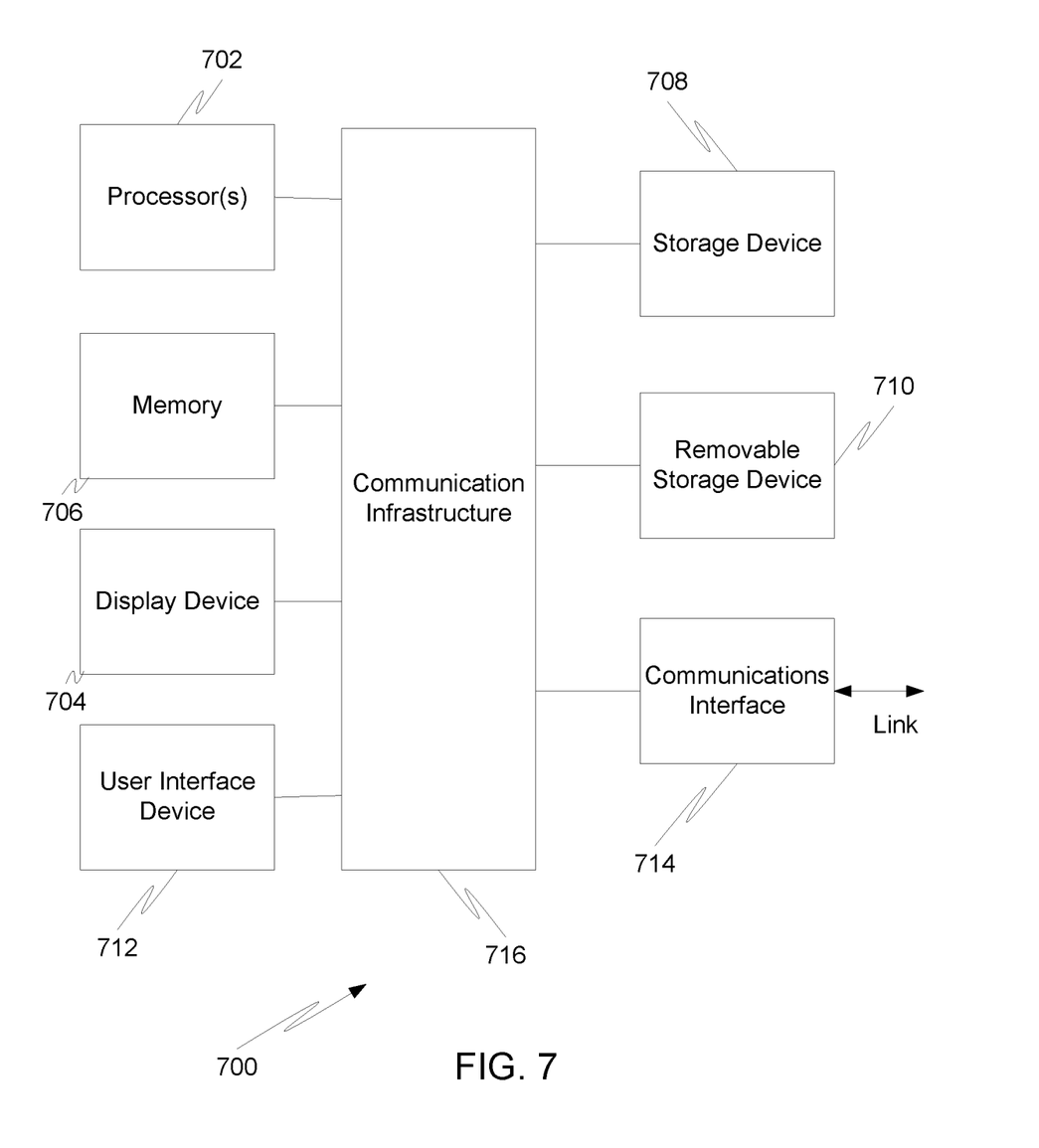
FIG. 7 is a schematic view of a computer system that may be used in practicing an embodiment.

To provide an example of a controller 624 in an embodiment, FIG. 7 is a high level block diagram showing a computer system 700 that is suitable for implementing a controller 624 used in embodiments. The computer system may have many physical forms ranging from an integrated circuit, a printed circuit board, and a small handheld device, up to a huge supercomputer. The computer system 700 includes one or more processors 702, and further can include an electronic display device 704 (for displaying graphics, text, and other data), a main memory 706 (e.g., random access memory (RAM)), storage device 708 (e.g., hard disk drive), removable storage device 710 (e.g., optical disk drive), user interface devices 712 (e.g., keyboards, touch screens, keypads, mice or other pointing devices, etc.), and a communication interface 714 (e.g., wireless network interface). The communication interface 714 allows software and data to be transferred between the computer system 700 and external devices via a link. The system may also include a communications infrastructure 716 (e.g., a communications bus, cross-over bar, or network) connected to the aforementioned devices/modules.

Information transferred via communications interface 714 may be in the form of signals such as electronic, electromagnetic, optical, or other signals capable of being received by communications interface 714, via a communication link that carries signals and may be implemented using wire or cable, fiber optics, a phone line, a cellular phone link, a radio frequency link, and/or other communication channels. With such a communications interface, it is contemplated that the one or more processors 702 might receive information from a network, or might output information to the network in the course of performing the above-described method steps. Furthermore, method embodiments may execute solely upon the processors or may execute over a network, such as the Internet, in conjunction with remote processors that share a portion of the processing.

The term "non-transient computer readable medium" is used generally to refer to media such as main memory, secondary memory, removable storage, and storage devices, such as hard disks, flash memory, disk drive memory, CD-ROM, and other forms of persistent memory, and shall not be construed to cover transitory subject matter, such as carrier waves or signals. Examples of computer code include machine code, such as one produced by a compiler, and files containing higher level code that are executed by a computer using an interpreter. Computer readable media may also be computer code transmitted by a computer data signal embodied in a carrier wave and representing a sequence of instructions that are executable by a processor.

While this disclosure has been described in terms of several exemplary embodiments, there are alterations, modifications, permutations, and various substitute equivalents, which fall within the scope of this disclosure. It should also be noted that there are many alternative ways of implementing the methods and apparatuses of the present disclosure. It is therefore intended that the following appended claims be interpreted as including all such alterations, modifications, permutations, and various substitute equivalents as fall within the true spirit and scope of the present disclosure.

What is claimed is:

1. A method for selectively etching at least one feature in a silicon oxide region with respect to a lower oxygen containing region, wherein the lower oxygen containing region and the silicon oxide region form a structure, wherein the silicon oxide region is adjacent to the lower oxygen containing region and wherein a mask is above at least part of the silicon oxide region and the lower oxygen containing region and wherein the mask provides an exposed part of the lower oxygen containing region and an exposed part of the silicon oxide region, comprising:
   providing an etch gas comprising a metalloid halide and/or a metal halide;
   forming the etch gas into a plasma; and
   simultaneously selectively etching at least one feature in the exposed part of the silicon oxide region with respect to the lower oxygen containing region and forming a metalloid or metal containing hardmask on the exposed part of the lower oxygen containing region, wherein a portion of the silicon oxide region below the mask is not etched and the metalloid or metal containing hardmask is not formed on a portion of the lower oxygen containing region below the mask.

2. The method, as recited in claim 1, wherein the etch gas further comprises a carbon containing component and a hydrogen containing component.

3. The method, as recited in claim 2, wherein the hydrogen containing component and the carbon containing component comprises at least one of a hydrocarbon or hydrofluorocarbon.

4. The method, as recited in claim 2, wherein the hydrogen containing component and the carbon containing component comprises at least one of $CH_2F_2$, $CHF_3$, $CH_3F$, $CH_4$, $C_4F_6$, $C_2H_2$, $CF_4$, and $C_4F_8$.

5. The method, as recited in claim 2, wherein the etch gas further comprises an oxygen containing component comprising at least one of $O_2$, $O_3$, $CO_2$, CO, NO, $NO_2$, $N_2O$, $SO_2$, $SO_3$, $H_2O$, $H_2O_2$, and COS.

6. The method, as recited in claim 2, wherein the etch gas further comprises an inert gas from the group consisting of nitrogen, helium, argon, and neon.

7. The method, as recited in claim 1, wherein a top side of the lower oxygen containing region is oxidized forming an oxidized layer and further comprising providing a selective pre-etch before providing the etch gas, wherein the selective pre-etch partially etches the at least one feature of the silicon oxide region and etches the oxidized layer over the exposed part of the lower oxygen containing region without forming a metalloid or metal containing hardmask.

8. The method, as recited in claim 7, wherein the metalloid or metal containing hardmask is deposited from where the oxide layer is etched.

9. The method as recited in claim 1, wherein the lower oxygen containing region comprises at least one of silicon, silicon germanium, germanium, elemental metal, and metal nitrides.

10. The method, as recited in claim 1, wherein the metalloid halide and/or the metal halide comprises $WF_6$ and/or $MoF_6$.

11. The method, as recited in claim 1, wherein the metalloid halide and/or the metal halide comprises at least one of silicon (Si), germanium (Ge), tin (Sn), titanium (Ti), zirconium (Zr), hafnium (Hf), vanadium (V), niobium (Nb), tantalum (Ta), boron (B), aluminum (Al), gallium (Ga), indium (In), iron (Fe), ruthenium (Ru), rhenium (Re), antimony (Sb), tungsten (W), molybdenum (Mo), and/or bismuth (Bi).

12. The method, as recited in claim 1, where the plasma is formed at a pressure of 2-500 millitorr with a power of 30-500 Watts.

13. The method, as recited in claim 1, further comprising providing an atomic layer etch of the at least one feature in the silicon oxide region after the simultaneously selectively etching the at least one feature in the silicon oxide region with respect to the lower oxygen containing region and forming the metalloid or metal containing hardmask over the lower oxygen containing region, wherein the atomic layer etch uses the metalloid or metal containing hardmask to reduce etching of the lower oxygen containing region.

14. The method, as recited in claim 1, wherein the at least one feature has a width of less than 15 nm and a depth to width aspect ratio of at least 6:1.

15. The method, as recited in claim 1, further comprising providing an additional etch of the at least one feature in the silicon oxide region after the simultaneously selectively etching the at least one feature in the silicon oxide region with respect to the lower oxygen containing region and forming the metalloid or metal containing hardmask over the lower oxygen containing region, wherein the additional etch uses the metalloid or metal containing hardmask as a mask for the lower oxygen containing region and without further depositing the metalloid or metal containing hardmask.

16. The method, as recited in claim 15, further comprising removing the metalloid or metal containing hardmask after the additional etch of the at least one feature.

17. The method, as recited in claim 16, wherein the removing the metalloid or metal containing hardmask comprises a wet clean.

18. The method, as recited in claim 1, further comprising providing a temperature of at least 30° C.

19. The method, as recited in claim 1, wherein the lower oxygen containing region is at least one of silicon nitride, silicon oxy-nitride, silicon oxy-carbo-nitride, silicon germanium, and germanium.

\* \* \* \* \*